United States Patent
Okamura et al.

(10) Patent No.: US 9,287,486 B2
(45) Date of Patent: Mar. 15, 2016

(54) MULTI-LAYER PIEZOELECTRIC ELEMENT, AND PIEZOELECTRIC ACTUATOR, INJECTION DEVICE, AND FUEL INJECTION SYSTEM PROVIDED WITH SAME

(75) Inventors: Takeshi Okamura, Aira (JP); Shigenobu Nakamura, Kirishima (JP)

(73) Assignee: Kyocera Corporation, Kyoto (JP)

(*) Notice: Subject to any disclaimer, the term of this patent is extended or adjusted under 35 U.S.C. 154(b) by 326 days.

(21) Appl. No.: 13/980,470
(22) PCT Filed: Jan. 20, 2012
(86) PCT No.: PCT/JP2012/051171
§ 371 (c)(1), (2), (4) Date: Oct. 15, 2013
(87) PCT Pub. No.: WO2012/099233
PCT Pub. Date: Jul. 26, 2012

(65) Prior Publication Data
US 2014/0026858 A1   Jan. 30, 2014

(30) Foreign Application Priority Data
Jan. 21, 2011  (JP) ................. 2011-011047

(51) Int. Cl.
*H01L 41/047* (2006.01)
*F02M 51/06* (2006.01)
(Continued)

(52) U.S. Cl.
CPC ....... *H01L 41/0471* (2013.01); *F02M 51/0603* (2013.01); *H01L 41/0533* (2013.01); *H01L 41/083* (2013.01); *F02M 63/0225* (2013.01)

(58) Field of Classification Search
CPC ............ F02M 51/0603; F02M 51/061; F02M 63/0026; F02M 51/0607; F02D 41/2096; H01L 41/00; H01L 41/04
USPC .......... 123/456, 498, 499, 490, 472; 239/102.2, 584–585.5; 310/314, 366, 310/316.03, 323.06, 311
See application file for complete search history.

(56) References Cited

U.S. PATENT DOCUMENTS 4,570,098 A * 2/1986 Tomita et al. .............. 310/346
6,845,920 B2 * 1/2005 Sato ..................... F02M 47/027
                                                239/102.1

(Continued)

FOREIGN PATENT DOCUMENTS

DE   102005013827 A1 * 11/2005 ............. H01L 41/16
JP       03108306 A    5/1991
(Continued)

OTHER PUBLICATIONS

International Search Report, PCT/JP2012/051171, Feb. 6, 2012, 2 pp.

*Primary Examiner* — Stephen K Cronin
*Assistant Examiner* — Xiao Mo
(74) *Attorney, Agent, or Firm* — Volpe and Koenig, P.C.

(57) ABSTRACT

There are provided a multi-layer piezoelectric element which is capable of suppression of occurrence of an imperfect area, suffers from no development of leakage current even with moisture intrusion, has long-term freedom from variations in displacement and can achieve stable driving, as well as to provide a piezoelectric actuator, an injection device, and a fuel injection system provided with the multi-layer piezoelectric element. A multi-layer piezoelectric element includes a stacked body in which piezoelectric layers and internal electrodes acting as positive and negative internal electrodes are laminated; an inorganic coating attached to a side surface of the stacked body where ends of both the positive internal electrodes and the negative internal electrodes are exposed; and metal particles composed predominantly of a metal element contained in the internal electrodes, the metal particles dispersed in the inorganic coating.

16 Claims, 8 Drawing Sheets

(51) Int. Cl.
  *H01L 41/053* (2006.01)
  *H01L 41/083* (2006.01)
  *F02M 63/02* (2006.01)

(56) References Cited

U.S. PATENT DOCUMENTS

| | | | |
|---|---|---|---|
| 2006/0132001 A1* | 6/2006 | Sugg | ............... H01L 41/0533 310/366 |
| 2009/0000092 A1 | 1/2009 | Sugg | |
| 2010/0276510 A1* | 11/2010 | Setoguchi | ............... 239/102.2 |
| 2011/0180623 A1* | 7/2011 | Kawamoto | ............... 239/102.2 |
| 2012/0187213 A1* | 7/2012 | Sata | ............... F02M 51/0603 239/102.2 |

FOREIGN PATENT DOCUMENTS

| | | |
|---|---|---|
| JP | 2001135871 A | 5/2001 |
| JP | 2002319718 A | 10/2002 |
| JP | 2003101092 A | 4/2003 |
| JP | 2006505144 A | 2/2006 |
| JP | 2007234799 A | 9/2007 |

* cited by examiner

MULTI-LAYER PIEZOELECTRIC ELEMENT, AND PIEZOELECTRIC ACTUATOR, INJECTION DEVICE, AND FUEL INJECTION SYSTEM PROVIDED WITH SAME

FIELD OF INVENTION

The present invention relates to a multi-layer piezoelectric element used for, for example, a piezoelectric driving element (piezoelectric actuator), a pressure sensor element, and a piezoelectric circuit element, and so forth, as well as to a piezoelectric actuator, an injection device, and a fuel injection system provided with the multi-layer piezoelectric element.

BACKGROUND

A multi-layer piezoelectric element is basically composed of a stacked body in which piezoelectric layers and internal electrode layers are laminated, and an external electrode bonded to a side surface of the stacked body so as to be electrically connected to the internal electrode layers.

A conventional multi-layer piezoelectric elements is provided with an exterior coating made of an organic material such as silicone resin or an inorganic material such as glass for the prevention of occurrence of leakage current in the surface of its stacked body that will result in variations in displacement. A multi-layer piezoelectric element is known that employs, as an inorganic material-made exterior coating (inorganic coating), a ceramic coating (ceramic cover layer) which is excellent in resistance to heat and resistance to moisture in particular (refer to Patent Literature 1).

CITATION LIST

Patent Literature

Patent Literature 1: Japanese Unexamined Patent Publication JP-A 2001-135871

SUMMARY

Technical Problem

However, when a multi-layer piezoelectric element having a glass- or ceramic-made inorganic coating formed on a surface of its stacked body is driven under high-temperature and high-humidity conditions for a long period of time, then an imperfect area may arise in glass portions (or grain-boundary portions in the case of using ceramic) of the inorganic coating due to a stress entailed by extension and contraction of the stacked body, and also intrusion of moisture may cause metal ion migration through the imperfect area, which poses the possibility of a flow of leakage current. As another possibility, the amount of displacement in the multi-layer piezoelectric element may be reduced due to generation of leakage current.

The invention has been devised in view of the circumstances as mentioned above, and accordingly an object of the invention is to provide a multi-layer piezoelectric element which is capable of suppression of occurrence of an imperfect area, suffers from no development of leakage current even with moisture intrusion, has long-term freedom from variations in displacement and can achieve stable driving, as well as to provide a piezoelectric actuator, an injection device, and a fuel injection system provided with the multi-layer piezoelectric element.

Solution to Problem

The invention provides a multi-layer piezoelectric element comprising: a stacked body in which piezoelectric layers and internal electrodes acting as positive and negative internal electrodes are laminated; an inorganic coating attached to a side surface of the stacked body where ends of both the positive internal electrodes and the negative internal electrodes are exposed; and metal particles composed predominantly of a metal element contained in the internal electrodes, the metal particles dispersed in the inorganic coating.

Here, it is preferable that the metal particles are unevenly distributed toward a surface side of the inorganic coating.

Further, it is preferable that the inorganic coating includes voids located on a side surface side of the stacked body.

Further, it is preferable that the inorganic coating is made of a piezoelectric material.

Further, it is preferable that the metal element contained in the internal electrodes is silver, and the metal particles are silver particles.

The invention provides a piezoelectric actuator comprising: any one of the above-described multi-layer piezoelectric elements of the invention; and a case that contains the multi-layer piezoelectric element therein.

The invention provides an injection device comprising: a container provided with an injection hole; and any one of the above-described multi-layer piezoelectric elements of the invention, a fluid stored in the container being injected through the injection hole by driving the multi-layer piezoelectric element.

The invention provides a fuel injection system comprising: a common rail configured to store a high-pressure fuel; the above-described injection device of the invention being configured to inject the high-pressure fuel stored in the common rail; a pressure pump configured to supply the high-pressure fuel to the common rail; and an injection control unit configured to send drive signals to the injection device.

Advantageous Effects of Invention

According to the multi-layer piezoelectric element of the invention, by virtue of the metal particles contained in the inorganic coating, since occurrence of an imperfect area can be suppressed to prevent generation of leakage current, the amount of displacement in the multi-layer piezoelectric element remains unchanged for a long period of time, with consequent stable driving.

DETAILED DESCRIPTION OF THE PREFERRED EMBODIMENTS

Hereinafter, embodiments of a multi-layer piezoelectric element according to the invention will be described in detail with reference to the drawings.

Figure 1:
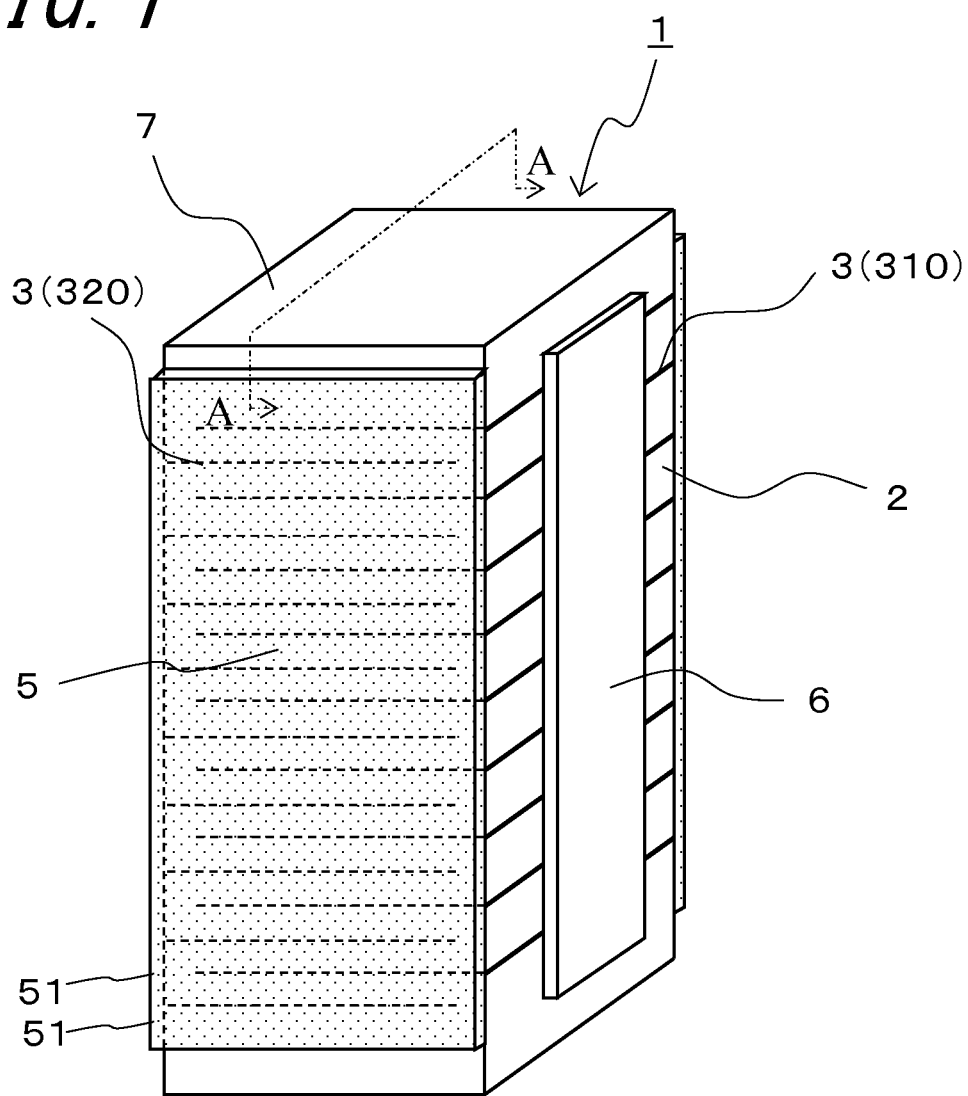
FIG. 1 is a perspective view showing a multi-layer piezoelectric element according to one embodiment of the invention.
Figure 2:
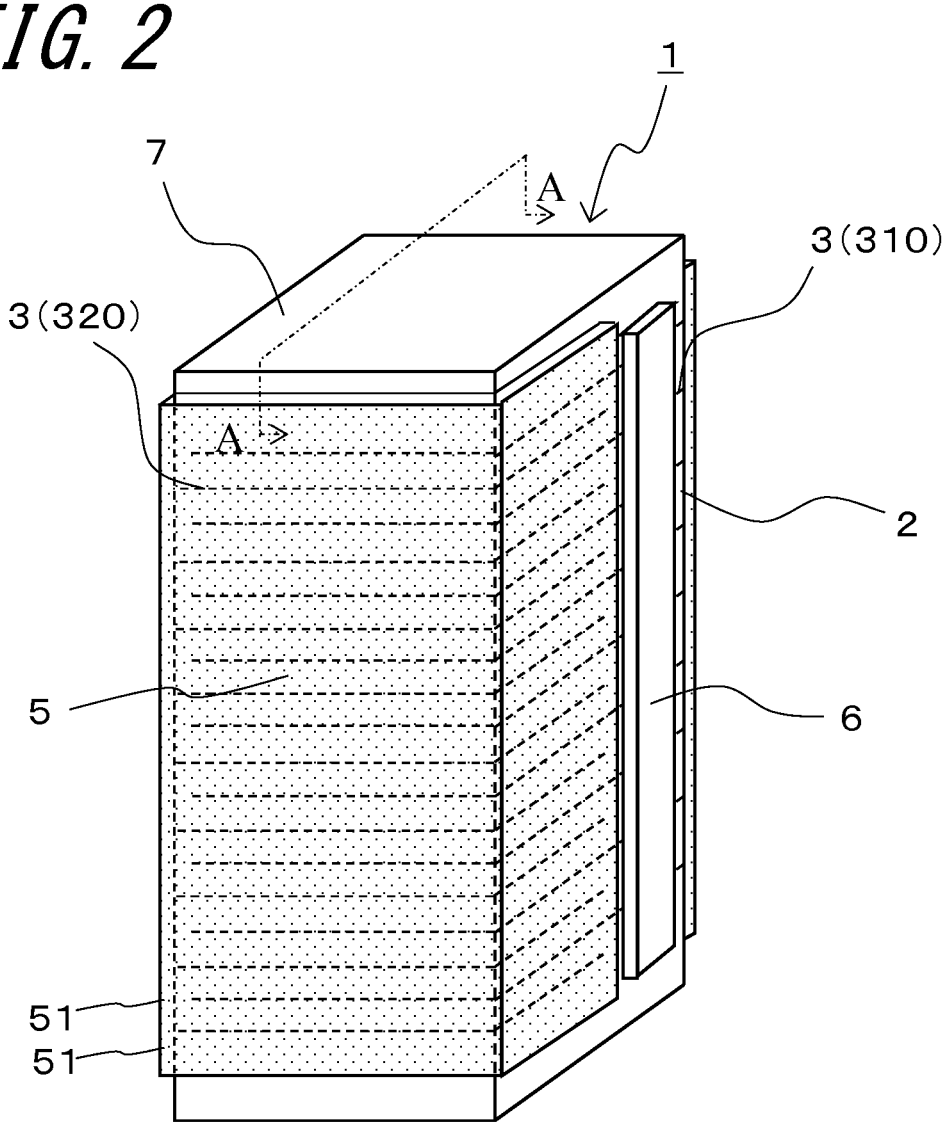
FIG. 2 is a perspective view showing a multi-layer piezoelectric element according to another embodiment of the invention.
Figure 3:
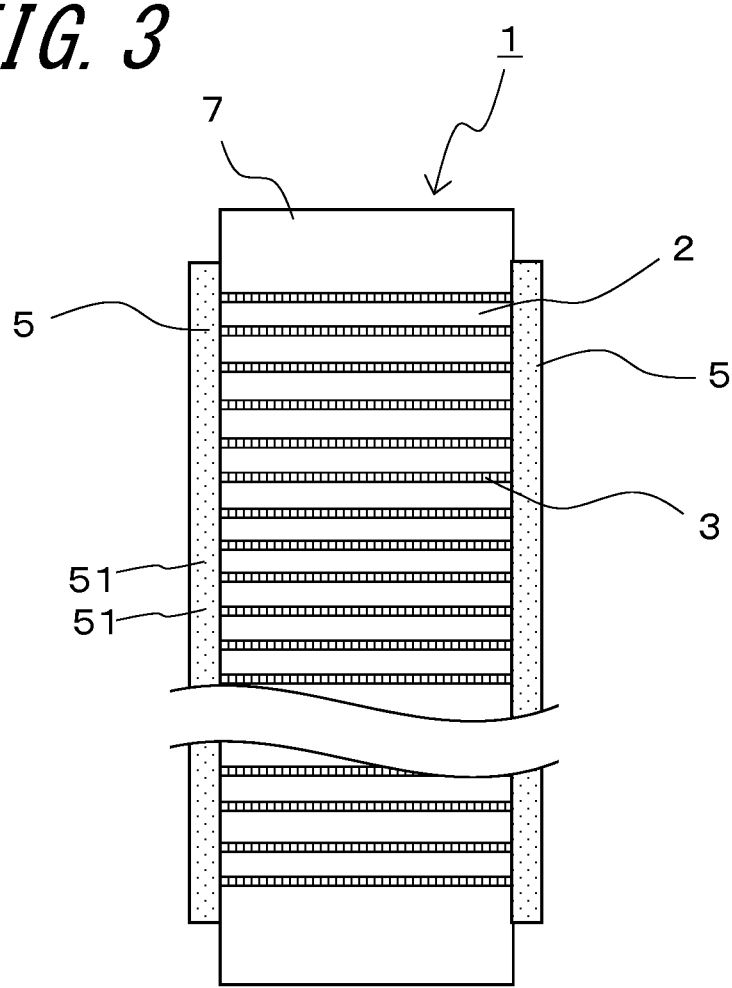
FIG. 3 is an example of a sectional view of the multi-layer piezoelectric element taken along the line A-A shown in FIGS. 1 and 2.
Figure 4:
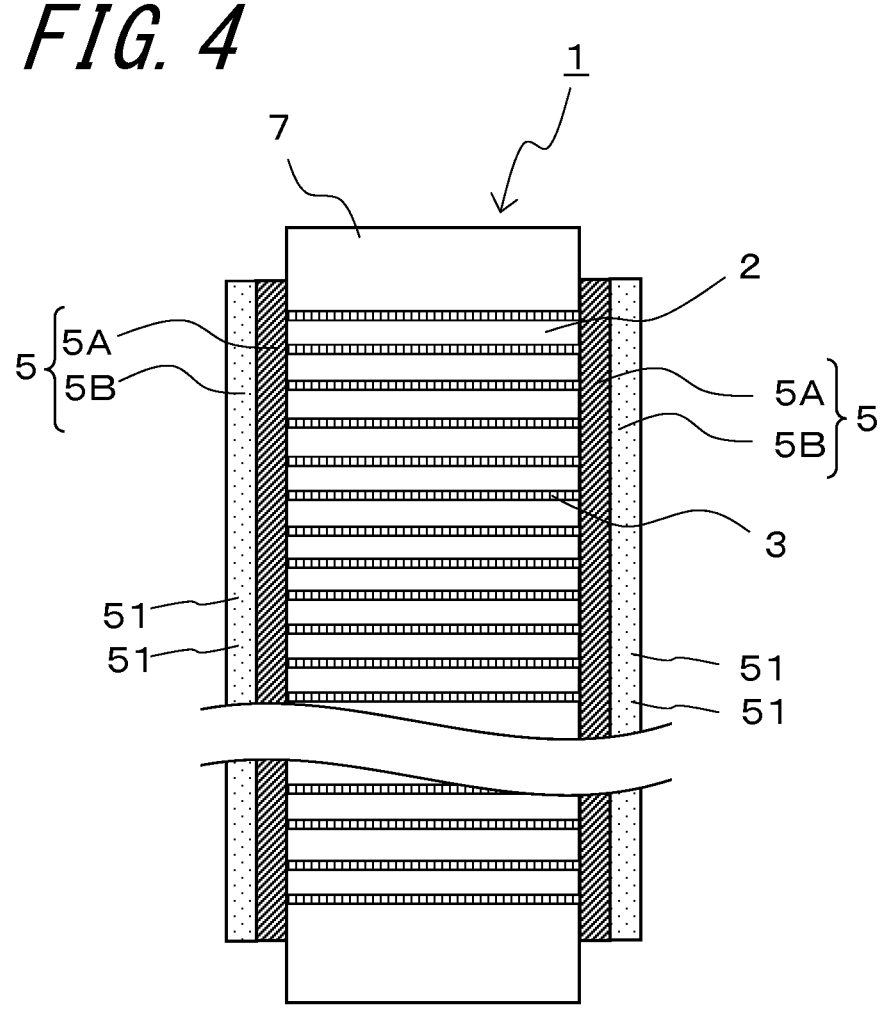
FIG. 4 is another example of a sectional view of the multi-layer piezoelectric element taken along the line A-A shown in FIGS. 1 and 2.
Figure 5:
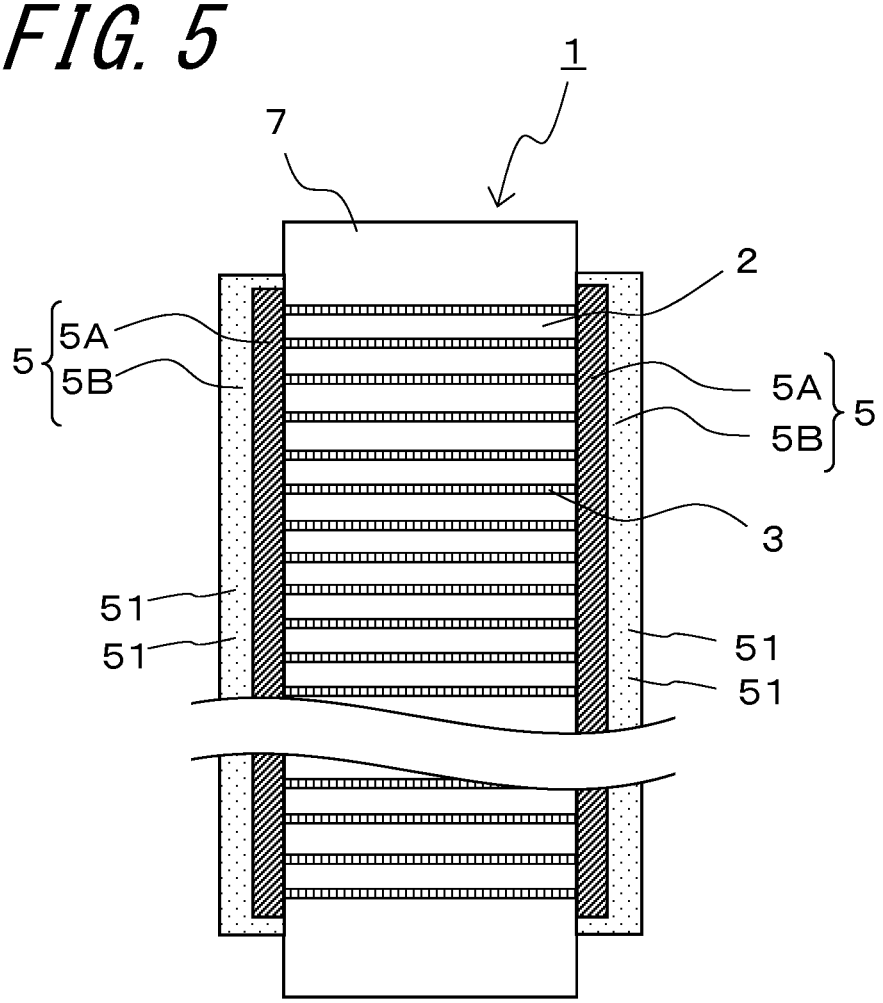
FIG. 5 is another example of a sectional view of the multi-layer piezoelectric element taken along the line A-A shown in FIGS. 1 and 2.

FIG. 1 is a perspective view showing a multi-layer piezoelectric element according to one embodiment of the invention, illustrating a case where an inorganic coating is applied to two side surfaces thereof. FIG. 2 is a perspective view showing a multi-layer piezoelectric element according to another embodiment of the invention, illustrating a case where an inorganic coating is applied to all side surfaces thereof. FIG. 3 is an example of a sectional view showing the multi-layer piezoelectric element taken along the line A-A shown in FIGS. 1 and 2. Moreover, FIGS. 4 and 5 are examples in which an inorganic coating of two-layer structure is provided.

As shown in FIGS. 1 and 3, a multi-layer piezoelectric element 1 of the present embodiment includes a stacked body 7 in which piezoelectric layers 2 and internal electrodes 3 are laminated; and external electrodes 6 disposed on a pair of side surfaces of the stacked body 7 so as to be electrically connected to the internal electrodes 3, an inorganic coating 5 attached to another pair of side surfaces of the stacked body 7 where ends of both positive internal electrodes 310 and negative internal electrodes 320 are exposed, and metal particles 51 composed predominantly of a metal element contained in the internal electrodes 3, the metal particles 51 dispersed in the inorganic coating 5.

The stacked body 7 constituting the multi-layer piezoelectric element 1 is configured, for example, so that the piezoelectric layers 2 and internal electrodes 3 are alternately laminated and the internal electrodes 3 are configured by alternately arranging the positive internal electrodes 310 and the negative internal electrodes 320. The stacked body 7 has a rectangular parallelepiped form which is, for example, 0.5 to 10 mm in length, 0.5 to 10 mm in width, and 1 to 100 mm in height.

The piezoelectric layer 2 constituting the stacked body 7 is made of piezoelectric ceramic having piezoelectric property, and, for example, a perovskite-type oxide such as PbZrO3—PbTiO3 (PZT: lead zirconate titanate) can be used therefor. The piezoelectric layer 2 has a thickness in a range of 3 μm to 250 μm, for example.

Moreover, the internal electrodes 3 constituting the stacked body 7 are alternately laminated with respect to the piezoelectric layers 2 in a manner such that one piezoelectric layer 2 is sandwiched between upper-located and lower-located internal electrodes 3, and more specifically the positive internal electrodes 310 and the negative internal electrodes 320 are arranged according to the laminating order, so that a driving voltage can be applied to the piezoelectric layer 2 sandwiched between them. The internal electrode 3 (the positive internal electrode 310, the negative internal electrode 320) is made of a metal such as silver-palladium (Ag—Pd), for example. In the case shown in FIG. 1, the positive internal electrodes 310 and the negative (or grounding) internal electrodes 320 are led out to paired opposed side surfaces of the stacked body 7 in a staggered arrangement so as to be electrically connected to the paired external electrodes 6 bonded to their respective side surfaces of the stacked body 7. The internal electrode 3 has a thickness in a range of 0.1 μm to 5 μm, for example.

The paired external electrodes 6, which are formed for example by application of a paste made of silver and glass with subsequent baking treatment, are bonded to their respective side surfaces of the stacked body 7 so as to be electrically connected to the internal electrodes 3 led out to the opposed side surfaces of the stacked body 7 in a staggered arrangement. The external electrode 6 has a thickness in a range of 1 to 500 μm, for example.

Moreover, at the other paired side surfaces of the stacked body 7 shown in FIG. 1, both of the positive internal electrodes 310 and the negative (or grounding) internal electrodes 320 are led out, with their ends left exposed. The inorganic coating 5 is applied to each of the other paired side surfaces of the stacked body 7 where the ends of both of the positive internal electrodes 310 and the negative internal electrodes 320 are exposed. These side surfaces are external electrode-6—free surfaces.

While examples of the material for the inorganic coating 5 include piezoelectric materials and alumina, a piezoelectric material having a low Young's modulus is desirable for use. Where the inorganic coating 5 is made of such a piezoelectric material, by virtue of the effect of crystal strains, the inorganic coating 5 can conform to the displacement of the stacked body 7 and is thus less prone to separation. Moreover, due to leakage electric field from the internal electrode 3 (electric field developed in a region which is not sandwiched between electrodes), the inorganic coating 5 undergoes displacement in the same direction as the direction of displacement of the adjacent piezoelectric layer 2, and thus can conform to the extension and contraction of the stacked body 7. Especially by using a piezoelectric material of the same type as that used for the piezoelectric layer 2, for example, PbZrO3—PbTiO3 (PZT: lead zirconate titanate), it is possible to suppress separation of the inorganic coating 5 caused by thermal expansion difference during baking and cooling process. It is also possible to suppress deterioration in the characteristics of the piezoelectric layer 2 resulting from diffusion of trace components of the piezoelectric layer 2 to the inorganic coating 5 entailed by baking. The inorganic coating 5 has a thickness in a range of 1 to 500 μm, for example.

Moreover, as shown in FIG. 3, the metal particles 51 composed predominantly of a metal element contained in the internal electrodes 3 are dispersed in the inorganic coating 5.

As used herein, the term "dispersed" means that an average value of metal particle 51-to-metal particle 51 distances is greater than an average particle size of the metal particles 51, and, for example, the average value of the metal particle 51-to-metal particle 51 distances falls in a range of 0.1 to 100 μm. This average value can be derived by observing the section of the construction by an electron microscope such as a scanning electron microscope (SEM) or a metallographic microscope to measure a number of particles included in a range defined by given line segments and particle-to-particle distances, and dividing the sum total of particle-to-particle distances by the number of particles.

In this way, since the metal particles 51 composed predominantly of a metal element contained in the internal electrodes 3 are dispersed in the inorganic coating 5, even if the inorganic coating 5 is subjected to a stress such as an external impacting force, development of a crack can be suppressed (occurrence of an imperfect area can be suppressed) by diffraction of a propagating stress or other effective action. This makes it possible to suppress that a flow of leakage current is caused by metal ion migration through the imperfect area.

It is preferable that the metal particles 51 contained in the interior of the inorganic coating 5 are smaller in particle size than ceramic particles constituting the inorganic coating 5 from the viewpoint of facilitating diffraction of a propagating stress. To be specific, preferably, a particle size of the ceramic particles falls in a range of 0.1 to 20 μm, whereas a particle size of the metal particles 51 falls in a range of 0.05 to 2 μm and is thus smaller than the particle size of the ceramic particles. As used herein, the term "particle size" refers to an average particle size derived by observing the section of the construction by an electron microscope such as a scanning electron microscope (SEM) or a metallographic microscope to measure a number of particles included in a range defined by given line segments and the lengths of line segments extending across particles, and dividing the sum total of the line-segment lengths by the number of particles.

Moreover, metal ions in a solid matter are diffused in accordance with Fick's law of diffusion. In a direction from the internal electrode 3, as well as the piezoelectric layer 2, of high concentration level to the inorganic coating 5 of low concentration level, metal ions travel through crystal grain boundaries, with ionized oxygen vacancies being moved in the reverse direction for charge compensation. Then, in the vicinity of the metal particles 51 contained in the inorganic coating 5, while the oxygen vacancies are eliminated through charge exchange, the metal ions converge to the metal particles 51. Therefore, since the metal ions can be inhibited from existence in the crystal grain boundaries in the inorganic coating 5, it is possible to prevent generation of leakage current even with intrusion of moisture, and thereby keep the amount of displacement in the multi-layer piezoelectric element 1 unchanged for a long period of time, with consequent stable driving.

Furthermore, even if the multi-layer piezoelectric element is continuously driven under high-temperature and high-humidity conditions, since the inorganic coating 5 is firmly bonded to the side surface of the stacked body 7, it is possible to suppress that the inorganic coating 5 comes unstuck and thus leakage current results from migration caused by intrusion of moisture. In addition, with the provision of the inorganic coating 5 as a cover layer, the multi-layer piezoelectric element can be used at high temperatures without any problem, even in use under high temperature at which a resin cover layer cannot be tolerant.

It is sufficient that the metal particles 51 are composed predominantly of a metal element contained in the internal electrodes 3, and therefore, for example, given that the metal element contained in the internal electrodes 3 is copper, then the metal particles 51 are made as copper-containing particles, and, given that the metal element contained in the internal electrodes 3 is silver, then the metal particles 51 are made as silver-containing particles. Silver, in particular, being relatively soft, is advantageous in terms of stress-absorption capability. In addition, since silver can exist stably as a metal rather than being an oxide within a range of temperatures around an ambient temperature, it is desirable to disperse silver particles as the metal particles 51 in the inorganic coating 5 in advance, because, even if silver ions are diffused from the internal electrode 3 into the inorganic coating 5, the silver ions will not be precipitated as silver oxide in the inorganic coating 5 but selectively gathered and captured at the metal particles 51 through charge exchange effected near the metal particles 51.

It is noted that the inorganic coating 5 is not limited in location to the external electrode 6—free surfaces alone as shown in FIG. 1, but may be applied to all of the side surfaces including the external electrode 6—bearing surfaces as shown in FIG. 2. In FIG. 2, in the external electrode 6—bearing surface, on a region thereof which bears the external electrode 6 and its nearby region, the end of one of the positive internal electrode 310 and the negative internal electrode 320 is exposed, whereas, on the other region of the external electrode 6—bearing surface, the end of each of the positive internal electrodes 310 and the negative internal electrodes 320 is exposed. By virtue of such a design, metal ions moving from the internal electrode 3 can be controlled in every direction, with consequent higher resistance to separation as is desirable.

Moreover, where the inorganic coating is applied also over a surface of the external electrode 6 and a surface of an external lead member connected to the external electrode 6, metal ions can be perfectly restrained against movement toward different polar regions, wherefore the multi-layer piezoelectric element 1 can be driven stably.

Furthermore, while the inorganic coating 5 may be applied over the entire other side surface of the stacked body 7 where the ends of both of the positive internal electrodes 310 and the negative internal electrodes 320 are exposed, as shown in FIG. 1, from the viewpoint of facilitating extension and contraction of the stacked body 7, it is good enough for the inorganic coating 5 to lie on the aforementioned other side surface so as to cover at least the ends of both of the positive internal electrodes 310 and the negative internal electrodes 320. That is, the inorganic coating 5 does not necessarily have to be applied over a part of the aforementioned other side surface close to each end, where the ends of the positive internal electrodes 310 and the negative internal electrodes 320 are not exposed.

In addition, it is preferable that the metal particles 51 contained in the inorganic coating 5 are unevenly distributed toward the surface side of the inorganic coating 5. In this case, since diffusion of metal ions occurs toward the metal particles 51 contained in the inorganic coating 5, it is possible to allow metal ions to move in a direction away from the electrodes of different polarity without fail.

The uneven distribution of the metal particles 51 toward the surface side of the inorganic coating 5 can be recognized by observing the section of the multi-layer piezoelectric element 1 by an electron microscope such as a scanning electron microscope (SEM) or a metallographic microscope to measure a number of the metal particles 51 included in a range extending from the surface of the inorganic coating 5 to a point spaced from the surface by a distance equal to one-third of the thickness, as well as a number of metal particles included in other given range, and comparing these numbers of metal particles.

In order to unevenly distribute the metal particles 51 contained in the inorganic coating 5 toward the surface side of the inorganic coating 5, for example, as shown in FIG. 4, the inorganic coating 5 may have a two-layer structure consisting of a metal particle 51—free inorganic coating 5A located on the side surface side of the stacked body and a metal particle 51-containing inorganic coating 5B located on the surface side of the inorganic coating 5.

At this time, more preferably, the inorganic coating 5A located on the side surface side of the stacked body has a thickness which is smaller than the internal electrode 3-to-internal electrode 3 distance (the distance between the positive internal electrode 310 and the negative internal electrode 320) in view of reduction in diffusion length. Note that the metal particles 51 contained in the surface-side inorganic coating 5B are similar to those in the case shown in FIG. 1 in respect of dispersion level and particle size.

Moreover, in the multi-layer piezoelectric element 1, the end of the stacked body 7 in the lamination direction undergoes maximum displacement, wherefore the end of the inorganic coating 5 in the lamination direction is most susceptible to stress, in consequence whereof there results an imperfect area extending from the internal electrode 3 situated at the end of the stacked body 7 in the lamination direction to glass portions (or grain-boundary portions in the case of using ceramic) of the inorganic coating 5, and then metal ions contained in the internal electrode 3 travel through the imperfect area to reach the internal electrode 3 of different polarity, which may cause a flow of leakage current. In light of this, as shown in FIG. 5, the metal particles contained in the inorganic coating 5 should preferably be unevenly distributed toward the end of the stacked body 7 in the lamination direction.

In this way, by exploiting the phenomenon in which metal ions are diffused from the internal electrode 3 of high concentration level to the inorganic coating 5 of low concentration level for convergence to the metal particles 51 contained therein, it is possible to inhibit the metal ions from existence in the crystal grain boundaries and thereby prevent generation of leakage current. As a result, the amount of displacement in the multi-layer piezoelectric element 1 remains unchanged for a longer period of time, with consequent stable driving.

Moreover, it is preferable that the inorganic coating 5 includes voids located on the side surface side of the stacked body 7. The provision of voids helps lessen the stress on the inorganic coating 5 in contact with the stacked body 7. This is especially advantageous in the case of adopting the two-layer structure, because it is possible to protect the first layer from cracking in crystal grain boundaries and thereby block passage of ions traveling through the gap between crystal particles toward the different electrode.

For example, a diameter of the voids falls in a range of 0.05 to 2 μm, and, where the voids are spread in a part of the inorganic coating 5 in the vicinity of the region between the internal electrodes 3 (between the positive internal electrode 310 and the negative internal electrode 320), the stress-lessening effect can be enhanced. This makes it possible to prevent cracking in crystal grain boundaries and thereby block passage of ions traveling through the gap between crystal particles toward the different electrode.

The distribution of voids in a part of the inorganic coating 5 which is located on the side surface side of the stacked body 7 can be recognized by observing the section of the multi-layer piezoelectric element 1 by an electron microscope such as a scanning electron microscope (SEM) or a metallographic microscope, and, the fact that voids gather more heavily in the part of the inorganic coating 5 close to the side surface of the stacked body than in the other part can be verified by measuring a number (proportion) of voids included in a range extending from an edge of the inorganic coating 5 close to the side surface of the stacked body to a point spaced from that side by a distance equal to one-third of the thickness, as well as a number (proportion) of voids included in the other given range, and comparing them.

Figure 6:
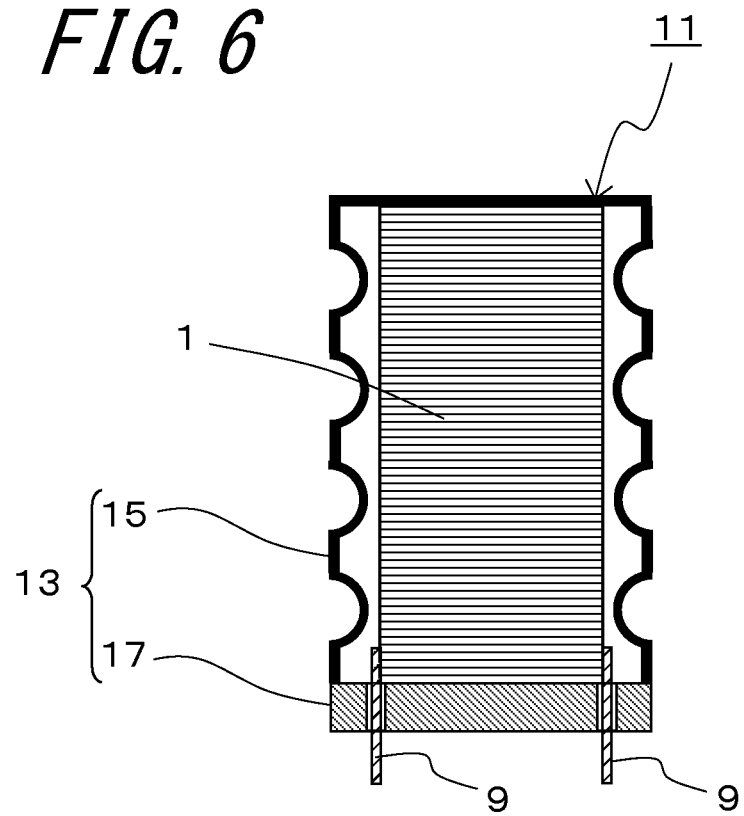
FIG. 6 is a schematic sectional view showing a piezoelectric actuator according to an embodiment of the invention.

Then, an external lead member 9 as shown in FIG. 6 is fixedly connected to the external electrode 6 by an electrically conducting connecting member such as solder or an electrically-conductive adhesive, and, a DC electric field of 0.1 to 3 kV/mm is applied, through the external lead member 9, to initiate polarization in the piezoelectric layer 2 constituting the stacked body 7, whereby the multi-layer piezoelectric element 1 as a whole can be polarized.

In this multi-layer piezoelectric element 1, the external electrode 6 and an external power source are connected to each other via the external lead member 9 as shown in FIG. 6 for application of driving voltage to the piezoelectric layers 2, so that each of the piezoelectric layers 2 can undergo significant displacement under an inverse piezoelectric effect.

Next, a method for manufacturing the multi-layer piezoelectric element 1 of the present embodiment will be described.

First of all, piezoelectric ceramic green sheets that constitute the piezoelectric layers 2 are prepared. More specifically, a ceramic slurry is prepared by mixing calcined powder of piezoelectric ceramics, a binder made of organic high polymer such as acrylic polymer or butyral polymer, and a plasticizer. Then, the ceramic slurry is shaped into piezoelectric ceramic green sheets by tape molding technique such as doctor blade method or calender roll method. The piezoelectric ceramics may be of any type so long as it has piezoelectric property, and, for example, a perovskite-type oxide made of lead zirconate titanate (PZT: PbZrO3—PbTiO3) can be used. Moreover, as the plasticizer, dibutyl phthalate (DBP), dioctyl phthalate (DOP), or the like can be used.

Next, an internal-electrode electrically conductive paste that constitutes the internal electrodes 3 is prepared. More specifically, the internal-electrode conductive paste is prepared by admixing a binder and a plasticizer in metal powder of a silver-palladium alloy. Note that a mixture of silver powder and palladium powder can be used instead of the silver-palladium alloy.

Subsequently, the internal-electrode conductive paste is applied, in internal-electrode 3 pattern, to the aforementioned piezoelectric ceramic green sheets by means of screen printing, for example.

Next, a predetermined number of piezoelectric ceramic green sheets with the internal-electrode conductive paste are stacked on top of each other.

The unfired stack is subjected to binder removal treatment at a predetermined temperature, and is then fired at a temperature in a range of 900 to 1200° C.

Then, the stack obtained by firing is ground at its side surfaces into a predetermined shape by means of a surface grinder or otherwise. In this way, a stacked body 7 in which piezoelectric layers 2 and internal electrodes 3 are alternately laminated can be constructed.

After that, an inorganic coating paste, which is prepared by blending a binder and a plasticizer into inorganic powder such as ceramic powder or glass powder containing metal particles composed predominantly of a metal element contained in the internal electrode, is applied to the side surface of the stacked body 7 by means of screen printing, dipping, or otherwise, and then baking is performed thereon at a temperature in a range of 500 to 1200° C. At this time, the inorganic coating paste is not applied to a surface of the stacked body on which the external electrode 6 is to be borne, or alternatively, the paste may be applied to that surface, but it is removed therefrom by means of grinding after baking. Note that, preferably, the ceramic powder contained in the inorganic coating paste is calcined powder of piezoelectric ceramics, and more preferably the ceramic powder has the same composition as that of the piezoelectric layer 2.

As exemplary of the method of unevenly distributing the metal particles 51 contained in the inorganic coating 5 toward the surface side of the inorganic coating 5, following the completion of application of a paste free of metal particles, a paste containing the metal particles 51 dispersed may be applied to the surface of the metal particle-free paste with subsequent firing treatment.

It is noted that the metal particles 51 may be dispersed in the inorganic coating 5 by any other method than that mentioned above in so far as the metal particles 51 are not applied externally so as to cover the surface of the inorganic coating 5 but are scattered in the inorganic coating 5 in an interspersed fashion.

After that, the external electrode 6 is formed by printing a silver-glass electrically-conductive paste, which is composed predominantly of silver and contains glass, in external-electrode 6 pattern, to the side surface of the stacked body 7 where the internal electrodes 3 are led out, with subsequent baking treatment at a temperature in a range of 650 to 750° C.

Next, the external lead member 9 is fixedly connected to the external electrode 6 by an electrically conducting connecting member such as solder or an electrically-conductive adhesive.

Subsequently, a DC electric field of 0.1 to 3 kV/mm is applied, through the external lead member 9 connected to each of the paired external electrode 6, to initiate polarization in the piezoelectric layer 2 constituting the stacked body 7, whereby the multi-layer piezoelectric element 1 as a whole can be polarized. In this multi-layer piezoelectric element 1, the external electrode 6 and an external power source are connected to each other via the external lead member 9 for application of driving voltage to the piezoelectric layers 2, so that each of the piezoelectric layers 2 can undergo significant displacement under an inverse piezoelectric effect. Thus, for example, the multi-layer piezoelectric element can be used for a piezoelectric actuator or operated as an automotive fuel-supply injection valve for injecting fuel into an engine.

Next, a piezoelectric actuator in accordance with the embodiment of the invention will be described. FIG. 6 is a schematic sectional view showing a piezoelectric actuator according to an embodiment of the invention.

As shown in FIG. 6, the piezoelectric actuator 11 of this embodiment includes a case 13 and the multi-layer piezoelectric element 1 contained in the case 13.

More specifically, the case 13 includes a case main body 15 having a closed upper end and an opened lower end, and a lid member 17 attached to the case main body 15 so as to close the opening of the case main body 15, and, inside the case 13 is enclosed the multi-layer piezoelectric element 1 along with, for example, inert gas, with its end faces abutted on the inner wall of the upper end and the inner wall of the lower end, respectively, of the case 13.

The case main body 15 and the lid member 17 are made of a metal material such as SUS 304 or SUS 316L.

The case main body 15 is designed as a tubular body having a closed upper end and an opened lower end, and has, for example, a bellows (accordion-pleated) configuration enabling extension and contraction in the lamination direction of the stacked body 7. Moreover, the lid member 17 is given, for example, a plate-like shape for closing the opening of the case main body 15. The lid member 17 is provided with two through holes for insertion of the external lead members 9, so that the external lead member 9 can be inserted through the through hole for electrical conduction between the external electrode 6 and the exterior thereof. A soft glass or the like is charged into the gap of the through hole to secure the external lead member 9, as well as to prevent intrusion of outside air.

According to the piezoelectric actuator 11 of this embodiment, long-term stable driving can be achieved.

Figure 7:
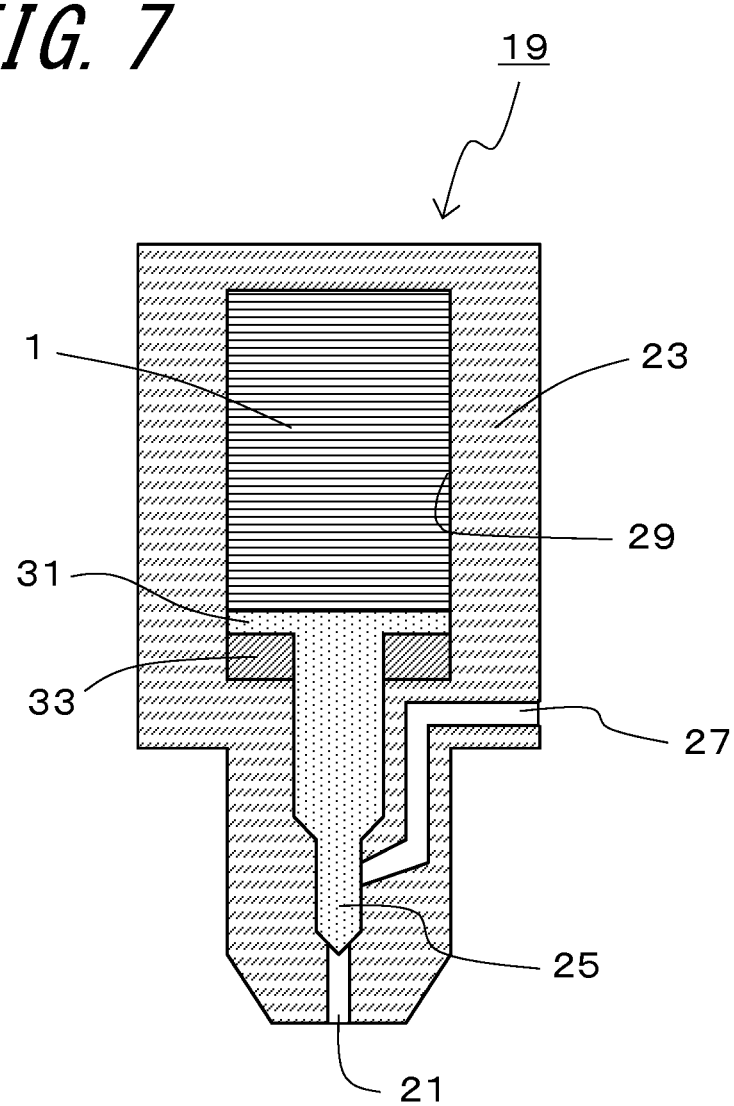
FIG. 7 is a schematic sectional view showing an injection device according to an embodiment of the invention.

Next, an injection device in accordance with the embodiment of the invention will be described. FIG. 7 is a schematic sectional view showing an injection device according to an embodiment of the invention.

As shown in FIG. 7, the injection device 19 of this embodiment includes a housing (container) 23 provided with an injection hole 21 at one end thereof and the multi-layer piezoelectric element 1 of the foregoing embodiment in the housing 23.

In an interior of the housing 23 is disposed a needle valve 25 capable of opening and closing of the injection hole 21. A fluid passage 27 is so disposed as to be capable of communicating with the injection hole 21 in accordance with the movement of the needle valve 25. The fluid passage 27 is coupled to an external fluid supply source, so that a fluid is supplied to the fluid passage 27 under high pressure at all times. Therefore, when the needle valve 25 is operated to open the injection hole 21, then a fluid which has been fed through the fluid passage 27 is injected to the outside or into an adjacent container, for example, a fuel chamber of an internal combustion engine (not shown).

An upper end of the needle valve 25 is a piston 31 which has an increased inner diameter and can slide along a cylinder 65 provided in the housing 23. Furthermore, the above-described multi-layer piezoelectric element 1 is placed within the housing 23 in contact with the piston 31.

In the injection device 19 thus constructed, upon extension of the multi-layer piezoelectric element 1 entailed by application of voltage, the piston 31 is pushed forward, thus causing the needle valve 25 to close the fluid passage 27 communicating with the injection hole 21 with a consequent halt on supply of fluid. Further, upon stopping the application of voltage, the multi-layer piezoelectric element 1 is contracted, and a disc spring 33 pushes the piston 31 backward. In consequence, the fluid passage 27 is opened and the injection hole 21 communicates with the fluid passage 27 so that injection of fluid through the injection hole 21 is carried out.

It is noted that the injection device may be so configured that the fluid passage 27 is opened by applying voltage to the multi-layer piezoelectric element 1, and is contrariwise closed by stopping the application of voltage.

Moreover, the injection device 19 of this embodiment may be so configured to include the housing 23 provided with the injection hole 21 and the multi-layer piezoelectric element 1 of the foregoing embodiment, wherein a fluid stored in the housing 23 is injected through the injection hole 21 by driving the multi-layer piezoelectric element 1. That is, the multi-layer piezoelectric element 1 does not necessarily have to be housed inside the housing 23, and it is thus sufficient that a pressure for the control of fluid injection can be applied to the interior of the housing 23 by driving the multi-layer piezoelectric element 1. In the injection device 19 of this embodiment, the term "fluid" is construed as encompassing not only fuel and ink, but also various matters in liquid form including an electrically-conductive paste and various matters in gaseous form. The use of the injection device 19 of this embodiment makes it possible to control the flow rate of fluid and the timing of fluid injection with stability for a long period of time.

In the case of using the injection device 19 of this embodiment employing the multi-layer piezoelectric element 1 of the foregoing embodiment for an internal combustion engine, as compared to the case of using an injection device of conventional design, a fuel can be injected into a combustion chamber of the internal combustion engine or the like with higher accuracy for a longer period of time.

Figure 8:
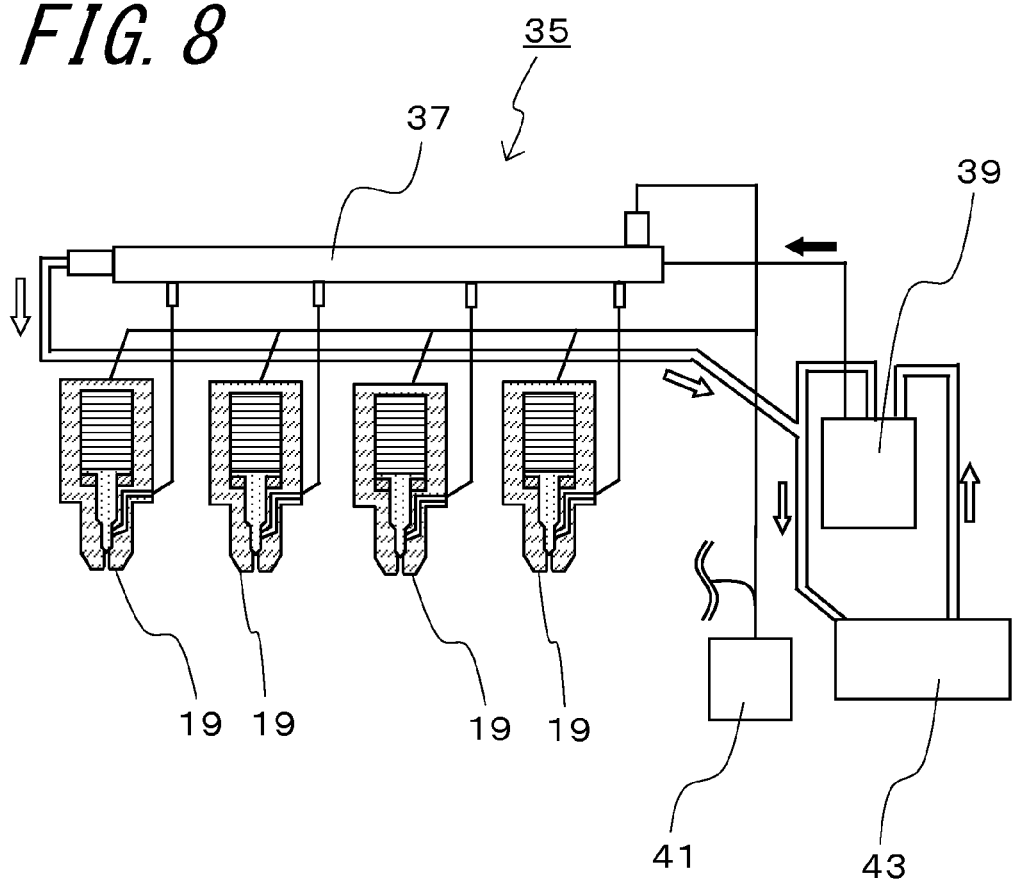
FIG. 8 is a schematic diagram showing a fuel injection system according to an embodiment of the invention.

Next, a fuel injection system in accordance with the embodiment of the invention will be described. FIG. 8 is a schematic diagram showing a fuel injection system according to an embodiment of the invention.

As shown in FIG. 8, the fuel injection system 35 of this embodiment includes a common rail 37 configured to store a high-pressure fuel which is a high-pressure fluid; a plurality of injection devices 19 of the foregoing embodiment, each of which is configured to inject the high-pressure fluid stored in the common rail 37; a pressure pump 39 configured to supply the high-pressure fluid to the common rail 37; and an injection control unit 41 configured to send drive signals to the injection devices 19.

The injection control unit 41 controls the amount of injection of the high-pressure fluid and injection timing on the basis of external information or external signals. For example, where the fuel injection system 35 of this embodiment is used for fuel injection into an engine, it is possible to control the amount of fuel injection and injection timing while detecting the conditions of the interior of the combustion chamber of the engine by means of a sensor or otherwise. The pressure pump 39 acts to feed a fluid fuel to the common rail 37 from a fuel tank 43 under high pressure. For example, in the fuel injection system 35 for use in engine application, the fluid fuel is fed to the common rail 37 under a pressure of as high as about 1000 to 2000 atmospheres (about 101 MPa to about 203 MPa), preferably a pressure of as high as about 1500 to 1700 atmospheres (about 152 MPa to about 172 MPa). The common rail 37 stores the high-pressure fuel which has been fed thereto from the pressure pump 39, and feeds it to the injection device 19 on an as needed basis. As has already been described, the injection device 19 injects a certain amount of fluid to the outside or into an adjacent container through the injection hole 21. For example, where a target of fuel supply by injection is an engine, the injection device injects the high-pressure fuel in a mist form into the combustion chamber of the engine through the injection hole 21.

According to the fuel injection system 35 of this embodiment, it is possible to perform the injection of high-pressure fuel as intended for a long period of time with stability.

It should be understood that the application of the invention is not limited to the specific embodiments described heretofore, and that various changes and modifications are possible without departing from the scope of the invention. For example, although, in the embodiments described earlier, one external electrode 6 is disposed on each of the opposed two side surfaces of the stacked body 7, two external electrodes 6 may be disposed on the adjacent side surfaces of the stacked body 7, or may be disposed on one and the same side surface of the stacked body 7. Moreover, in a direction perpendicular to the lamination direction, the stacked body 7 may have, instead of a quadrangular sectional profile as shown in the foregoing embodiments, a polygonal, for example, hexagonal or octagonal sectional profile, a circular sectional profile, or a sectional profile defined by a combination of a straight line and an arc.

For example, the multi-layer piezoelectric element 1 of this embodiment can be used for a piezoelectric driving element (piezoelectric actuator), a pressure sensor element, a piezoelectric circuit element, and so forth. Examples of the driving element include a fuel injection device for an automotive engine, a liquid injection device such as an ink-jet system, a precise positioning device such as an optical device, and an anti-vibration device. Examples of the sensor element include a combustion pressure sensor, a knocking sensor, an acceleration sensor, a load sensor, an ultrasound sensor, a pressure-detecting sensor, and a yaw-rate sensor. Examples of the circuit element include a piezoelectric gyroscope, a piezoelectric switch, a piezoelectric transformer, and a piezoelectric breaker.

EXAMPLES

Hereinafter, examples of the multi-layer piezoelectric element of the invention will be described.

A piezoelectric actuator provided with the multi-layer piezoelectric element of the invention was produced in the following manner. To begin with, a ceramic slurry was prepared by mixing calcined powder of piezoelectric ceramics composed predominantly of lead zirconate titanate (PZT: $PbZrO_3$—$PbTiO_3$) having an average particle size of 0.4 μm, a binder, and a plasticizer. The ceramic slurry was formed into a 100 μm-thick piezoelectric ceramic green sheet for forming piezoelectric layers by the doctor blade method.

Then, an internal-electrode conductive paste for forming internal electrodes was prepared by adding a binder to a silver-palladium alloy. Where the silver-palladium ratio of the paste is concerned, the content of silver stands at 95% by mass, and the content of palladium stands at 5% by mass.

Subsequently, the internal-electrode conductive paste was printed to one side of the piezoelectric ceramic green sheet by the screen printing technique.

Next, after a stack of 300 piezoelectric ceramic green sheets with printed internal-electrode conductive paste was prepared as a core, a total of 15 piezoelectric ceramic green sheets free of printed internal-electrode conductive paste was laminated on the uppermost and lowermost layers of the core.

Then, the stack has been fired at a temperature in a range of 980 to 1100° C. to obtain a stacked body. The stacked body thus obtained has been ground into a predetermined shape by a surface grinder.

Subsequently, an inorganic coating paste was prepared by adding a binder and a plasticizer to calcined powder having the same composition as that of the aforementioned piezoelectric ceramic powder and metal powder composed predominantly of a metal element contained in the internal electrode. More specifically, the inorganic coating paste was prepared by blending silver powder or powder of a silver-palladium alloy having an average particle size of 0.5 μm into calcined powder of piezoelectric ceramic composed predominantly of lead zirconate titanate (PZT: $PbZrO_3$—$PbTiO_3$) having an average particle size of 0.4 μm so that the content of the metal powder falls in a range of 5 to 20% by mass, and adding a binder and a plasticizer thereto.

The inorganic coating paste was printed to the side surface of the stacked body except for the external electrode-bearing surface, and, following the completion of drying, baking has been performed thereon at a temperature in a range of 980 to 1100° C. The thickness of the baked inorganic coating was found to be 10 μm.

Moreover, after the inorganic coating paste was printed and dried as above, once again, the inorganic coating paste was printed thereon, and, following the completion of drying, baking has been performed thereon at a temperature in a range of 980 to 1100° C. The thickness of the baked inorganic coating in this test sample was found to be 20 μm.

Next, the external electrode was formed by printing a silver-glass paste prepared by adding glass, a binder, and a plasticizer to silver powder, in external electrode pattern, to the side surface of the stacked body, performing drying, and performing baking at a temperature of 700° C. Then, as the external lead member, a lead wire was fixedly connected to the external electrode by solder.

In the manner as above described, there were fabricated examples of the multi-layer piezoelectric element of the invention (Samples Nos. 2 to 4) each including the stacked body in which the piezoelectric layers and the internal electrodes are laminated; the external electrode bonded to the side surface of the stacked body so as to be electrically connected to the internal electrodes; and the inorganic coating applied to the side surface of the stacked body.

In Sample No. 2, the inorganic coating was made by dispersing, in the grain boundaries of piezoelectric ceramic composed predominantly of lead zirconate titanate (PZT: PbZrO3—PbTiO3) having an average particle size of 2 μm, silver particles having an average particle size of 0.5 μm in a manner such that they are spaced apart by a distance of about 2 μm, and the thickness of the inorganic coating was 10 μm.

In Sample No. 3, on a 10 μm-thick inorganic coating made of piezoelectric ceramic composed predominantly of lead zirconate titanate (PZT: PbZrO3—PbTiO3) having an average particle size of 2 μm, a 10 μm-thick inorganic coating was formed by dispersing, in the grain boundaries of piezoelectric ceramic composed predominantly of lead zirconate titanate (PZT: PbZrO3—PbTiO3) having an average particle size of 2 μm, silver particles having an average particle size of 1 μm in a manner such that they are spaced apart by a distance of about 2 μm; that is, the inorganic coating was given a total thickness of 20 μm.

In Sample No. 4, on a 10 μm-thick inorganic coating made of piezoelectric ceramic composed predominantly of lead zirconate titanate (PZT: PbZrO3—PbTiO3) having an average particle size of 2 μm, a 10 μm-thick inorganic coating was formed by dispersing, in the grain boundaries of piezoelectric ceramic composed predominantly of lead zirconate titanate (PZT: PbZrO3—PbTiO3) having an average particle size of 2 μm, silver-palladium particles having an average particle size of 1 μm in a manner such that they are spaced apart by a distance of about 2 μm; that is, the inorganic coating was given a total thickness of 20 μm.

Meanwhile, by way of comparative example (Sample No. 1), with an inorganic coating paste prepared by using calcined powder of piezoelectric ceramic composed predominantly of lead zirconate titanate (PZT: PbZrO3—PbTiO3) having an average particle size of 0.4 μm alone, there was formed a 10 μm-thick inorganic coating made of piezoelectric ceramic composed predominantly of lead zirconate titanate (PZT: PbZrO3—PbTiO3) having an average particle size of 2 μm.

Subsequently, in each of the multi-layer piezoelectric elements of Sample Nos. 1 to 4, a DC electric field of 3 kV/mm has been applied to the external electrode via the external lead member for 15 minutes to effect polarization in the piezoelectric layers.

Tests have been carried out on the multi-layer piezoelectric elements of Sample Nos. 1 to 4 by a method involving a step of driving them continuously on a 1×10$^6$-cycle basis in an atmosphere of 150° C., with application of AC voltage ranging from 0 V to +160 V at a frequency of 150 Hz, and a step of impressing DC of 150 V on them for 300 hours in an atmosphere of 85° C. and 85% RH. The results of the tests are shown in Table 1.

TABLE 1

| Sample No. | Presence of Metal Particles | Structure | Coating Thickness (μm) | Metal Component | Distance between Metal Particles | Particle Size of Scattered Metal | Amount of Displacement in Initial State (μm) | Amount of Displacement after Continuous Driving (1 × 10$^6$ cycles) (μm) | Presence of Crack |
|---|---|---|---|---|---|---|---|---|---|
| *1 | Absent | FIG. 3 | No Metal 10 μm | — | — | — | 40 μm | 20 μm | Present |
| 2 | Present | FIG. 3 | Metal Dispersed 10 μm | Ag | ca. 5 μm | 0.5 μm | 40 μm | 40 μm | Absent |
| 3 | Present | FIG. 5 | 20 μm Metal Dispersed 10 μm/ No Metal 10 μm | Ag | ca. 2 μm | 1 μm | 39 μm | 39 μm | Absent |
| 4 | Present | FIG. 5 | 20 μm Metal Dispersed 10 μm/ No Metal 10 μm | Ag/Pd = 90/10 | ca. 2 μm | 1 μm | 39 μm | 38 μm | Absent |

Asterisk (*) indicates sample out of scope of the invention.

The test results showed that the practical examples of the multi-layer piezoelectric element of the invention (Sample Nos. 2 to 4) are free from generation of leakage current at the side of the stacked body without variations in displacement even after continuous driving operation on a 1×10$^6$-cycle basis, with subsequent application of DC voltage under high-temperature and high-humidity environmental conditions to cause displacement, and are thus capable of affording high reliability. Following the completion of the tests, these test samples were sectioned to observe the interior of the inorganic coating by a scanning electron microscope (SEM), and, as the result of the observation, they showed no sign of cracking and migration in the inorganic coating.

On the other hand, in the multi-layer piezoelectric element of comparative example (Sample No. 1), after continuous driving operation on a 1×10$^6$-cycle basis with application of AC voltage ranging from 0 V to +160 V, a sign of decrease in the amount of displacement was seen, whereafter the test sample was sectioned to observe the interior of the inorganic coating by a scanning electron microscope (SEM), and, as the result of the observation, in the presence of a stress developed by extension and contraction of the stacked body, a plurality of cracks have appeared in between the ends of the internal electrode in the range of the inorganic coating due to generation of leakage current.

When a sample of Sample No. 1 has been newly prepared and has been continuously driven with application of AC voltage ranging from 0 V to +160 V, a sign of decrease in the amount of displacement was seen likewise. Then, as an additional test, DC of 150 V has been impressed thereon in an atmosphere of 85° C. and 85% RH, and, after 100 hours has elapsed, inconveniently, sparking took place on the surface of the inorganic coating. This sample was cut to observe the interior of the inorganic coating by a scanning electron microscope (SEM), and, from the observation result, it has been confirmed that silver contained in the internal electrode migrated through the cracks developed in the inorganic coating due to the application of DC voltage under high-temperature and high-humidity environmental conditions.

REFERENCE SIGNS LIST

1: Multi-layer piezoelectric element
2: Piezoelectric layer
3: Internal electrode
310: Positive internal electrode
320: Negative internal electrode
5: Inorganic coating
5A: Inorganic coating located on side surface side of Stacked body
5B: Inorganic coating located on surface side thereof.
51: Metal particle
6: External electrode
7: Stacked body
9: External lead member
11: Piezoelectric actuator
13: Case
15: Case main body
17: Lid member
19: Injection device
21: Injection hole
23: Housing (Container)
25: Needle valve
27: Fluid passage
29: Cylinder
31: Piston
33: Disc spring
35: Fuel injection system
37: Common rail
39: Pressure pump
41: Injection control unit
43: Fuel tank

What is claimed is:

1. A multi-layer piezoelectric element, comprising:
a stacked body having at least two exposed side surfaces and at least two other side surfaces in which piezoelectric layers and internal electrodes acting as positive internal electrodes and negative internal electrodes are laminated;
an inorganic coating attached to the two exposed side surfaces of the stacked body where ends of both the positive internal electrodes and the negative internal electrodes are exposed;
external electrodes disposed on the other side surfaces that are electrically connected to the internal electrodes; and
metal particles composed predominantly of a metal element contained in the internal electrodes, the metal particles dispersed in the inorganic coating.

2. The multi-layer piezoelectric element according to claim 1,
wherein the metal particles are unevenly distributed so that a concentration of metal particles is lower proximate to the internal electrodes than a concentration proximate to an outer surface of the inorganic coating.

3. The multi-layer piezoelectric element according to claim 1,
wherein the inorganic coating includes voids located on the side surface sides of the stacked body.

4. The multi-layer piezoelectric element according to claim 1,
wherein the inorganic coating is made of a piezoelectric material.

5. The multi-layer piezoelectric element according to claim 1,
wherein the metal element contained in the internal electrodes is silver, and the metal particles are silver particles.

6. A piezoelectric actuator, comprising:
the multi-layer piezoelectric element according to claim 1; and
a case that contains the multi-layer piezoelectric element therein.

7. An injection device, comprising:
a container provided with an injection hole; and
the multi-layer piezoelectric element according to claim 1,
a fluid stored in the container being injected through the injection hole by driving the multi-layer piezoelectric element.

8. A fuel injection system, comprising:
a common rail configured to store a high-pressure fuel;
the injection device according to claim 7, the injection device being configured to inject the high-pressure fuel stored in the common rail;
a pressure pump configured to supply the high-pressure fuel to the common rail; and
an injection control unit configured to send drive signals to the injection device.

9. A multi-layer piezoelectric element, comprising:
a stacked body in which piezoelectric layers and internal electrodes acting as positive internal electrodes and negative internal electrodes are laminated; and
an inorganic coating attached to a side surface of the stacked body where ends of both the positive internal electrodes and the negative internal electrodes are exposed, wherein the inorganic coating includes metal particles unevenly dispersed in a ceramic.

10. The multi-layer piezoelectric element according to claim 9,
wherein the metal particles are unevenly distributed so that a concentration of metal particles is lower proximate to the internal electrodes than a concentration proximate to an outer surface of the inorganic coating.

11. The multi-layer piezoelectric element according to claim 9,
wherein the inorganic coating includes voids located on the side surface side of the stacked body.

12. The multi-layer piezoelectric element according to claim 9,
wherein the inorganic coating is made of a piezoelectric material.

13. The multi-layer piezoelectric element according to claim 9,
wherein a metal element contained in the internal electrodes is silver, and the metal particles are silver particles.

14. A piezoelectric actuator, comprising:
the multi-layer piezoelectric element according to claim 9; and
a case that contains the multi-layer piezoelectric element therein.

15. An injection device, comprising:
a container provided with an injection hole; and
the multi-layer piezoelectric element according to claim 9,
a fluid stored in the container being injected through the injection hole by driving the multi-layer piezoelectric element.

16. A fuel injection system, comprising:
a common rail configured to store a high-pressure fuel;
the injection device according to claim 15, the injection device being configured to inject the high-pressure fuel stored in the common rail;
a pressure pump configured to supply the high-pressure fuel to the common rail; and
an injection control unit configured to send drive signals to the injection device.

\* \* \* \* \*